United States Patent [19]

McWilliams et al.

[11] 4,139,401

[45] Feb. 13, 1979

[54] METHOD OF PRODUCING ELECTRICALLY ISOLATED SEMICONDUCTOR DEVICES ON COMMON CRYSTALLINE SUBSTRATE

[75] Inventors: Donald A. McWilliams, Placentia; Charles H. Fa, Costa Mesa; George A. Larchian, Northridge; Oral F. Maxwell, Jr., Santa Ana, all of Calif.

[73] Assignee: Rockwell International Corporation, El Segundo, Calif.

[21] Appl. No.: 725,223

[22] Filed: Apr. 26, 1968

Related U.S. Application Data

[63] Continuation of Ser. No. 339,717, Jan. 23, 1964, abandoned.

[51] Int. Cl.² .................. H01L 21/76; H01L 27/12
[52] U.S. Cl. ........................... 148/175; 29/577 R; 29/578; 29/580; 357/49
[58] Field of Search ............... 148/175, 1.5; 117/201, 117/212, 106; 29/577, 578, 580; 317/234, 235, 101; 357/49

[56] References Cited

U.S. PATENT DOCUMENTS 3,391,023  7/1968  Frescura ............... 117/212

Primary Examiner—L. Dewayne Rutledge
Assistant Examiner—W. G. Saba
Attorney, Agent, or Firm—H. Fredrick Hamann; G. Donald Weber, Jr.; Robert Ochis

[57] ABSTRACT

Semiconductor segments are embedded in a crystalline substrate. Each of the segments are insulated from each other and from the substrate so that they can be used in fabricating semiconductor devices.

24 Claims, 16 Drawing Figures

INVENTORS
DONALD A. MCWILLIAMS
CHARLES H. FA
GEORGE A. LARCHIAN
ORAL F. MAXWELL JR.

BY

ATTORNEY

METHOD OF PRODUCING ELECTRICALLY ISOLATED SEMICONDUCTOR DEVICES ON COMMON CRYSTALLINE SUBSTRATE

CROSS-REFERENCE TO RELATED APPLICATIONS

This application is a continuation of U.S. Pat. application Ser. No. 339,717, filed Jan. 23, 1964, and now abandoned.

Electrically Isolated Semiconductor Devices on Common Crystalline Substrates, Ser. No. 847,807, filed July 25, 1969 now abandoned, by Donald A. McWilliams, Charles H. Fa, George A. Larchian, and Oral F. Maxwell, Jr. Application, Ser. No. 847,807 is a continuation of an application, Ser. No. 549,373, filed May 11, 1966 now abandoned, by the same title, which was a continuation of application, Ser. No. 327,900, filed Dec. 4, 1963 now abandoned, by the same title. The specification of the present application is essentially identical to the specification of application, Ser. No. 847,807. The present application claims a process for forming electrically isolated semiconductor devices on common crystalline substrates, and the claims of application, Ser. No. 847,807 are directed towards the product of electrically isolated semiconductor devices on common crystalline substrates.

This invention relates to a method of producing electrically isolated semiconductor devices on a common crystalline substrate, and more particularly to a method of embedding segments or chips of a semiconductor in a crystalline substrate, each electrically isolated from each other and from the substrate, for use in fabricating integrated circuits. An integrated circuit is defined as an electronic circuit which provides a function through the use of interconnected devices such as transistors, diodes, resistors and capacitors, each made from an electrically isolated semiconductor segment by any of the known techniques, including epitaxial crystal growth, oxidation, diffusion, evaporation, deposition and metalization in many different combinations.

It is common practice in the manufacture of integrated circuits to employ a common substrate for two or more circuit elements or devices fabricated in a semiconductor, and to electrically isolate the devices with a back-biased junction expressly provided for that purpose by diffusing the isolative or boundary regions with the same impurities as the substrate. When the devices of an integrated circuit are properly connected to sources of biasing potentials, the substrate, which now includes the diffused isolating region, is connected to a source of bias potential selected to provide back-biased junctions between the substrate and devices to be isolated.

The back-biased junctions provide electrical isolation because, as is commonly known, a back-biased junction restrains the flow of current through it. Consequently, no carriers cross the junction, except those thermally generated at the junction. If the ambient temperature is low, the reverse current due to the thermally generated carriers is negligible and the resistance across the junction is very high. However, the use of such a back-biased junction for isolating devices in an integrated circuit is not entirely satisfactory.

A major disadvantage of using a back-biased junction for isolation in an integrated circuit is that the ultimate circuit performance is severely limited by the parasitic capacitance associated with the junction. The charge density of the holes and electrons on opposite sides of the junction produce a potential variation across the junction in a manner analogous to the way in which an electric field is produced between the plates of a capacitor. Thus, owing to its geometry, the junction diode exhibits high capacitance which results in slow-speed circuit operation, and a low gain band-width product.

Another disadvantage of the prior art is that the substrate is thereby made an integral part of the circuit. That gives rise to other problems, such as connecting the substrate to a heat sink, or chassis, because the isolating junction may withstand only a limited reverse biasing voltage. If the limit is exceeded, even momentarily, the back-biased junction conducts heavily due to a phenonema referred to as avalanche multiplication of carriers generally understood to be a result of collision by higher velocity carriers in the higher electric field. Once the avalanche breakdown potential is reached, the integrated circuit will surely fail to function properly. Accordingly, the low voltage limitation of the back-biased junction for isolating devices imposes great limitations on the design of integrated circuits.

The back-biased isolation junction also has a disadvantage of requiring a long processing time to produce the isolating regions by diffusion of impurities through the semiconductor material.

An object of this invention is to provide novel methods of producing electrically isolated segments of a semiconductor on a common substrate.

This is accomplished in one embodiment by (1) selectively etching grooves in a high-grade semiconductor (out of which devices for an integrated circuit are to be fabricated) wherever electrical isolation is desired; (2) coating the etched side of the semiconductor, including the surfaces of the grooves, with a thin film of thermally compatible, electrically insulating material; (3) depositing a thermally compatible material on the insulating film, including the film in the grooves, to form a substrate for the semiconductor; and (4) lapping the exposed surface of the high-grade semiconductor until the substrate material in the isolating grooves is exposed. The insulating film may be provided by oxidizing or nitridizing the etched surface of the semiconductor, including the grooves, or alternatively depositing thereon a film of a thermally compatible, electrically insulating material, as by pyrolytic or vapor deposition techniques.

The deposition of a thermally compatible substrate on the insulating film may be by either standard vacuum deposition techniques widely practiced or other deposition techniques widely practiced in the art of epitaxially growing crystals. Accordingly, the term "vapor deposition," or more simply "deposition," is employed herein to refer generically to both techniques.

Other objects and advantages will become apparent from the following description with reference to the illustrations of a sample high-grade semiconductor divided into a plurality of electrically isolated segments on a common crystalline substrate.

Figure 1:
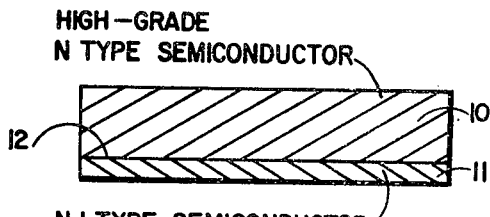
FIG. 1 is a cross-sectional view of at least a portion of a semiconductor having an interface of n and n+ type layers extending throughout.

In one embodiment of the invention, as illustrated in the drawings and described hereinafter with reference to specific examples of materials and processing techniques, the semiconductor is, for example, silicon with impurities of either the n or p type, or both. For illustration, the semiconductor is selected to be a high-grade silicon wafer uniformly doped with impurities of the n type in one layer 10 and more heavily doped with the same type of impurities in a second layer 11 to form an interface 12. By starting with such a structure, the high-grade layer 10 may later be processed to form semiconductor devices such as diodes, transistors, etc., but not until after it has been suitably divided into electrically isolated segments in accordance with the present invention by isolating material in a desired pattern, such as the pattern 13 illustrated in FIG. 2.

For best results, the isolating material should consist of substantially the same material as the semiconductor or a compound thereof so that it will be thermally compatible with the semiconductor into which an integrated circuit is to be fabricated. By thermal compatibility it is meant that the characteristics of the respective materials are matched closely enough so that stresses, strains, separations or fractures will not result, either in the isolating material or the semiconductor, and the structure and functioning of the circuit fabricated therein is not impaired as a consequence of wide variations in processing and operating temperatures in the range encountered in process steps employed to fabricate devices in the isolated segments, such as 1300° C. for diffusing impurities in the semiconductor segments, and temperatures as low as −200° C. for some applications or operating environments. The exact range of temperatures over which thermal compatibility is to be provided obviously should be determined in each instance by the process and operating temperatures to which the resulting structure is to be subjected, but a wide range is of course to be desired. Thus, in accordance with the illustrated embodiment of the invention, the material selected for the isolating regions is substantially intrinsic silicon, but electrically isolated from the layer of silicon 10 by a thin film of silicon dioxide or silicon nitride. However, other thermally compatible materials may be selected which exhibit high electrical resistance, and which may be vapor deposited, such as alumina or beryllium oxide.

In the following description frequent reference will be made to a semiconductor of which silicon is but one example. Accordingly, the term "semiconductor" as applied herein is to be interpreted in its broadest sense to include not only silicon and germanium, the two most widely used semiconductors for such devices as diodes and transistors, but also such other semiconductors as may be suitably adapted to the fabrication of devices for integrated circuits, such as gallium arsenide, gallium phosphide, indium antimonide, cadmium sulfide and other intermetallic compounds.

Figure 2:
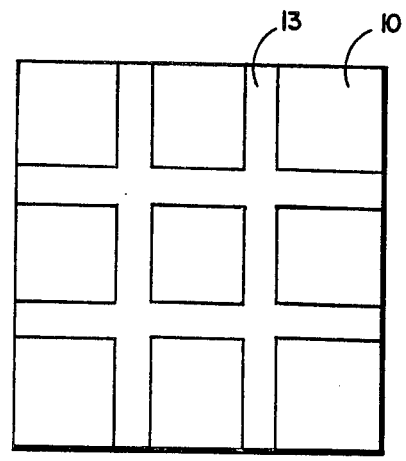
FIG. 2 is a plan view of the semiconductor of FIG. 1 showing a typical pattern of isolating regions desired in the semiconductor of FIG. 1 to divide it into a plurality of electrically isolated segments.

To provide the isolating material in the pattern 13 of FIG. 2 in accordance with the present invention, one face of the semiconductor, shown as the bottom face in FIG. 1, is first oxidized to an oxide thickness of approximately 10,000 Å, preferably by a dry oxidizing process, such as by placing it in a heated (1100° C.) environment of oxygen and very little or no water. The resulting film 20 is illustrated in FIG. 2 as silicon dioxide ($SiO_2$) but it should be understood that it may also be any compatible insulating material which may be produced or vapor deposited as a thin film. For instance, a nitride of the semiconductor, namely silicon nitride ($Si_3N_4$, $Si_3N_2$, SiN), may be provided by a thermal dissociation reaction of anhydrous ammonia in a nitrogen gas atmosphere. An alternative method is to heat the silicon (1100° C.) in a mixture of silicon tetrachloride and anhydrous ammonia vapors in a hydrogen gas atmosphere in varying proportions depending upon the nitride composition desired.

It should be noted that both silicon dioxide and silicon nitride can be deposited on other semiconductors, such as germanium, indiumantimonide, gallium-arsenide, etc., by pyrolytic decomposition of organic compounds of silicon. Examples of organic compounds are tetraethoxysilane for silicon dioxide and trichlorosilozine for silicon nitride. The important characteristic of the dioxide or nitride film is high impedance to the flow of electricity, regardless of how produced in order to provide an electrically insulating film. Since alumina and beryllium oxide have similar characteristics, an insulating film of alumina or beryllium oxide may be deposited instead.

Since the semiconductor is to be divided into electrically isolated segments in a desired pattern, it is necessary to etch isolating grooves into the semiconductor in the isolating regions between the segments. This may be accomplished by using standard techniques. Such techniques may consist of first spin-coating the surface of the oxide film 20 with a photosensitive and chemical resistive emulsion and exposing the emulsion to activating rays of light, such as ultra-violet light, through a negative of the desired pattern 13 (FIG. 2) to be etched. The latent image of the pattern is then developed in the emulsion by fixing the exposed emulsion and washing away the unexposed emulsion, thereby leaving a photoresist mask for the etching process. It should be understood that a symmetrical pattern is employed for simplicity in the illustration. In actual practice, the pattern will depend upon the design of the integrated circuit the elements of which are to be fabricated in the isolated segments.

Figure 4:
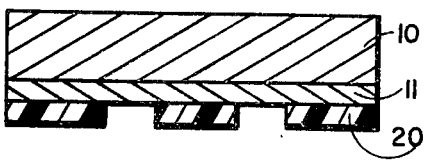

A suitable etchant is employed to dissolve exposed regions of the film 20, as illustrated in FIG. 4, using the photo-resist mask just described. For the film of silicon dioxide, a suitable etchant is a buffered solution of hydrofluoric acid.

Figure 5:
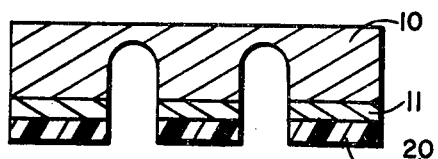

The next step illustrated in FIG. 5 consists of etching grooves in the semiconductor, with a suitable etchant which dissolves the semiconductor more rapidly than the oxide or nitride film. The depth of the etch is controlled in order to leave sufficient material along the upper surface of the layer 10 to hold the structure together for further processing.

The following table illustrates some of the semiconductors which may be employed and the etchants suitable for the material selected.

| Semiconductor | Etchants | Inactive with $SiO_2$ |
|---|---|---|
| Si | HCl Vapor | Catechol:Hydrazine (1:10) |
| Ce | HCl Vapor | KOH or NaOH Solution |
| GaAs | $H_2O_2:H_2SO_4:H_2O$ (1:3:1) | $HNO_3$:HCl (1:1) |
| GaP | $HNO_3$:HCl (1:1) | NaOH Solution |

| Semiconductor | Etchants Inactive with SiO$_2$ | |
| --- | --- | --- |
| InSb | HNO$_3$:HCl (1:1) | HNO$_3$ (Concentrated) |

Figure 3:
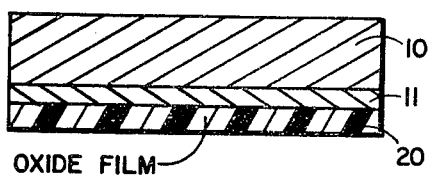
FIGS. 3 to 9 are views similar to FIG. 1 illustrating succeeding steps of but one process for providing the desired isolating regions in accordance with the present invention.

Etchants for those semiconductors which are inactive with silicon nitride are nitric acid, hydrofluoric acid and acetic acid, with other neutral buffering agents. As noted before, certain chemical resistive emulsions can be used for selective etching of all semiconductors. Thus, by using suitable photo-resists and etchants, the initial oxidizing and etching steps illustrated FIGS. FIG. 3 and 4 may be omitted.

Figure 8:
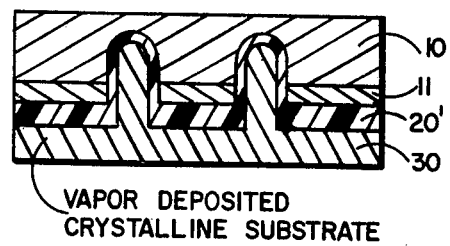
Figure 6:
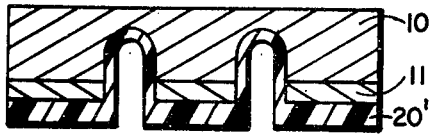

In the next step depicted in FIG. 6, the semiconductor etched in the preceding step is first cleaned and then oxidized to a thickness of approximately 10,000 Å. The entire oxide film 20', including that in the etched, grooves, is then coated with a mixture containing a hydrocarbon or colloidal carbon dissolved in a suitable solvent which leaves an even distribution of organic matter. Upon being baked in a high temperature oven, the organic matter decomposes to form free carbon particles which in turn immediately react at elevated temperatures (approximately 1100° C.) with the silicon of the silicon dioxide film to form silicon-carbide particles 25 which serve as growth nucleation centers for a crystalline substrate 30 (FIG. 8). Although the organic or carbon particles 25 are not essential, they have been found to be desirable in order to achieve a rapid initial coverage of uniform, high-resisitivity, crystalline deposit which adheres firmly to the oxide film.

It should be noted that the drawings are intended to illustrate but one embodiment of the invention in the various steps of preparation, and that the dimensions shown are not proportional.

Figure 7:
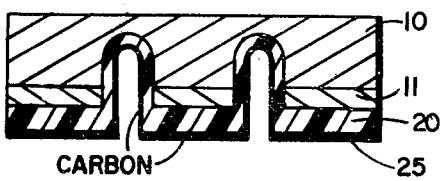

To deposit the silicon substrate 30 of FIG. 8, the structure of FIG. 7 is placed in a heated furnace with the silicon-carbide particles exposed to a gas stream which is initially hydrogen gas (H$_2$). The temperature of the structure is raised to approximately 1100° C., at which time a large quantity of vaporous silicon tetrachloride (SiCl$_4$) is added to the hydrogen gas stream. Under those conditions, a rapid growth of silicon ensues from each nucleating particle of silicon carbide. The process is allowed to continue until approximately 0.005 inch of crystalline substrate has been deposited. The structure is then cooled in a stream of hydrogen gas and removed from the furnace. Thereafter, the surface of the deposited crystalline substrate 30 is lapped until it is parallel to the oxide film which separates it from the semiconductor material.

It must be realized that a wise variety of hydrocarbons in suitable organic solvents may be used in preparing the silicon dioxide surface so that at elevated temperatures (1100° C. to 1300° C.) the silicon-carbide particles can be readily formed. In addition, the application of colloidal carbon or graphite in a wide variety of suitable organic solvents may be used in a similar manner to prepare the silicon dioxide surface for the vapor deposition of a crystalline substrate.

If alumina, or beryllium oxide, is employed to provide both the insulating film 20' and the substrate 30, the steps of FIGS. 6 and 8 are combined and the step of FIG. 7 is omitted. Thus, by using alumina or beryllium oxide for both the insulating film and the substrate, the process may be reduced to the steps of FIGS. 5, 6 and 8 where the steps of FIGS. 6 and 8 are combined. The steps of FIGS. 3 and 4 could, of course, be omitted as suggested hereinbefore.

In the final step, the surface of the layer 10 of the semiconductor opposite the substrate 30 is lapped until the vapor deposited crystal in the grooves or isolating regions is exposed in the pattern of FIG. 2. It is now apparent that the resulting structure consists of a plurality of semiconductor segments 35 embedded in a crystalline substrate 30 with an insulating film 20' isolating the segments from each other and from the substrate. For instance, in the illustrated example of FIG. 9, segments of n type silicon are embedded in a substrate of vapor deposited silicon with a film of silicon dioxide therebetween. The silicon dioxide film constitutes an electrical insulator having very high electrical resistance and being thermally compatible with silicon over a very large temperature range.

It should be noted that for the purpose of this invention, the techniques of depositing substrates of any of the materials mentioned, including alumina and beryllium oxide, may be referred to generally as vapor deposition, even though for some materials a vacuum is preferred as the environment for the operation. To deposit alumina or beryllium oxide, electron beam bombardment may be used to create a vapor of the material.

Figure 9:
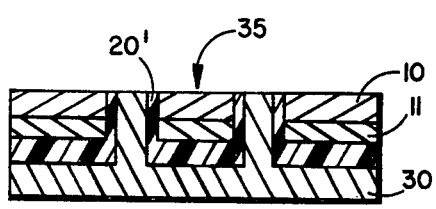

A principal advantage of the structure illustrated in FIG. 9 is that the deleterious effect of capacitance between the semiconductor segments and the crystalline substrate is greatly reduced because the crystalline substrate need not be electrically connected in a circuit with the semiconductor segments to provide back-biased junctions for electrical isolation. Thus, devices fabricated in the segments, such as transistors, are embedded in and electrically isolated from each other by a good insulator that is thermally compatible with the semiconductor. Another distinct advantage is that the metal base of a container to which the substrate is connected does not become electrically connected to the integrated circuit. In that manner, good thermal conduction from the integrated circuit may be provided to the metal base without establishing an electrical connection therebetween.

An inherent overall advantage of electrically isolating the semiconductor devices in accordance with the present invention is that the circuits formed by interconnecting such devices through existing techniques can be designed without regard to biasing potentials relative to the substrate or breakdown voltages between the devices and the substrate. In that manner an extraordinary number of design problems normally experienced are eliminated. On the other hand, the structure of FIG. 9 in no way changes the established techniques for producing and interconnecting semiconductor devices because once the semiconductor segments are isolated, the fabrication of integrated circuits is in accordance with present practices.

Figure 10:
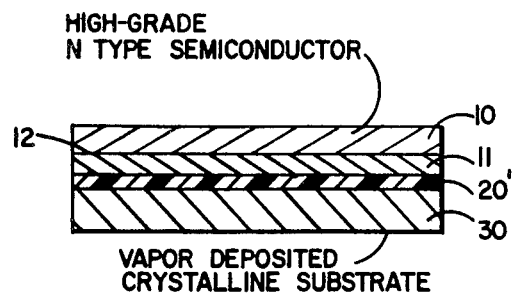
FIGS. 10 to 16 are similar to FIGS. 3 to 9 illustrating succeeding steps of a second embodiment of the invention.
Figure 11:
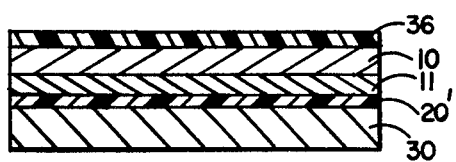

The second embodiment will now be described with reference to FIGS. 10 to 16, in which the reference numerals designate the same corresponding parts of the embodiment described with reference to FIGS. 1 to 9. The structure illustrated in FIG. 10 is first prepared by providing an insulating film 20' or silicon dioxide on a high-grade semiconductor diffused with n type impurities in one layer 10 and with a greater concentration of the same type of impurities in a layer 11 to form an interface 12. A silicon substrate 30 is deposited on the insulating film 20' in the same manner as described hereinbefore with reference to FIGS. 7 and 8 for the first embodiment.

It shown be noted that, as with the first embodiment, various ones of different materials may be selectively used at each step provided only that they be thermally compatible.

Figure 12:
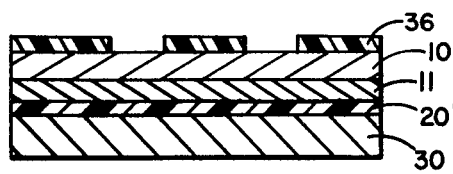
Figure 13:
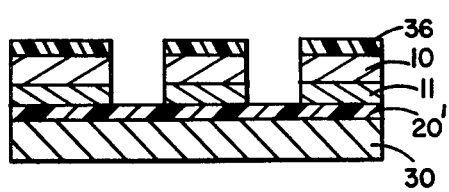

The surface of the layer 10 is then lapped and a silicon dioxide layer 36 deposited or otherwise provided. Isolating grooves are then etched as illustrated in FIGS. 12 and 13 in the same manner as described with reference to FIGS. 4 and 5 of the first embodiment.

Since an etchant is employed which dissolves the semiconductor more rapidly than the silicon dioxide, such as solution of hydrofluoric acid, a substantial portion of the silicon dioxide film 20' may be left exposed at the bottom of the grooves, but that is of no consequence, since the objective is simply to isolate segments of the semiconductor.

Figure 14:
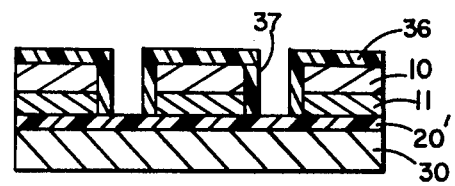
Figure 15:
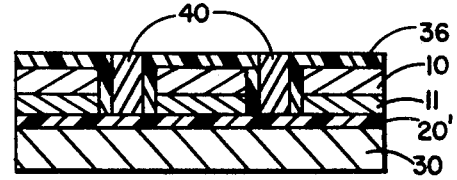
Figure 16:
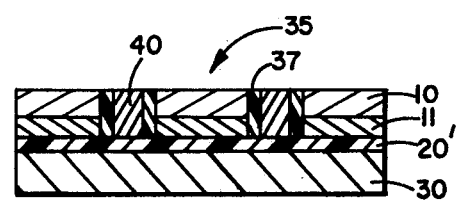

A silicon dioxide film 36 is then formed in the grooves on the walls of the semiconductor segments as illustrated in FIG. 14. Thereafter, silicon 40 is vapor deposited in the grooves by first providing in the grooves silicon-carbide nucleating particles in a manner similar to that described with reference to FIGS. 7 for the first embodiment. The silicon 40 thus deposited effectively forms an integral part of the substrate 30 since only the thin film 20' of silicon dioxide separates them.

In the final step, the side of the structure opposite the substrate 30 is lapped to expose the semiconductor 10, thereby providing semiconductor segments 35 embedded in a crystalline substrate of silicon with a film of electrically isolating silicon dioxide 20', 37 between them, just as in the first embodiment illustrated in FIG. 9, except that the substrate is comprised of the base portion 30 and the isolating portion 40. Accordingly, for both the embodiment of FIG. 9 and the embodiment of FIG. 16, the semiconductor segments 35 are said to be embedded in a crystalline substrate with a film of electrically isolating material therebetween.

Once again, if alumina or beryllium oxide is employed for the base portion 30 and the isolating portion 40 of the substrate, the insulating oxide films 20' and 37 may be omitted. In that manner the process is simplified to the four basic steps of depositing the substrate 30, etching the grooves through the semiconductor to the substrate 30, depositing the substrate material in the grooves, and finally lapping the side of the semiconductor opposite the substrates 30.

While the principles of the invention have now been made clear in two illustrative embodiments, there will be immediately obvious to those skilled in the art many modifications. The appended claims are therefore intended to cover and embrace any such modifications, within the limits only of the true spirit and scope of the invention.

We claim:

1. A method of making an integrated circuit structure having circuit devices in semiconductor islands which are isolated from each other by insulating material, said method including the steps of: selectively removing semiconductor material from one side of a monocrystalline semiconductor element about regions thereof where said islands are to be formed to form recesses surrounding the islands, applying insulating material to said one side of said element to a thickness which is insufficient to fill the recesses surrounding the islands and applying material of a type differing from said insulating material to fill the recesses surrounding the islands and to cover said one side to form a supporting substrate for said islands, removing enough semiconductor material from the entire side of said semiconductor element opposite said one side to expose said insulating material at said opposite side while leaving monocrystalline semiconductor islands of a desired thickness available at said opposite side, and fabricating circuit devices in said islands.

2. A process for forming a composite semiconductor body having a plurality of semiconductor regions separated by insulation comprising:

forming a first layer of semiconductor material of a first conductivity type having an upper and a lower surface;

forming a substantially planar second layer adjacent and adherent to the upper surface of said first layer, said second layer comprising a material that protects said upper surface from unwanted contamination;

forming a third layer of supporting material adjacent and adherent to the exposed portion of said second layer, said third layer capable of being removed by a substance that will not affect said second layer;

selectively removing portions of said first layer from the lower surface thereof, the removed portions extending through to said second layer;

forming a fourth layer of insulating material along the lower surface of said first layer including said removed portions, whereby semiconductor regions separated by electrical insulation are formed.

3. The process recited in claim 2 wherein said first layer of semiconductor material is monocrystalline, the step of forming said third layer comprises growing a layer of polycrystalline semiconductor material upon said second layer, and, the step of selectively removing portions of said first layer comprises mesa etching with a substance that is non-reactive with said second layer.

4. The process recited in claim 1 wherein said supporting crystalline material is polycrystalline and said semiconductor body is comprised of a single crystal semiconductor.

5. The method recited in claim 1 further comprising the step of forming electrical conductors interconnecting devices in different islands.

6. A process for forming a composite semiconductor body having a plurality of semiconductor regions separated by insulation comprising:

forming a first layer of semiconductor material of a first conductivity type having an upper and a lower surface;

forming a substantially planar second layer adjacent and adherent to the upper surface of said first layer, said second layer comprising a material that protects said upper surface from unwanted contamination;

forming a third layer of supporting material adjacent and adhherent to the exposed portion of said second layer, said supporting material being a different material than the material comprising the second layer;

selectively removing portions of said first layer from the lower surface thereof, the removed portions extending through to said second layer;

forming a fourth layer of insulating material along the lower surface of said first layer including said removed portions, whereby semiconductor regions separated by electrical insulation are formed.

7. A process for forming electrically isolated segments of semiconductor material in a common substrate comprising the steps of:
   forming grooves in a preselected pattern in one surface of a semiconductor body;
   producing an adherent thin film of electrically isolating material on the surface of said grooves, said film having a thickness which is insufficient to fill the grooves;
   depositing electrically insulating crystalline material sufficient to form a substrate in said grooves on said thin film, said electrically insulating crystalline material having thermal expansion characteristics compatible with said semiconductor body and being a different material than said thin film; and
   removing from the resulting structure enough material from the side opposite said one surface to expose said electrically isolating material at said opposite side, while leaving electrically isolated semiconductor segments of a desired thickness exposed at said opposite side.

8. The process recited in claim 7 wherein the electrically insulating crystalline support material is selected from the group consisting alumina and beryllium oxide.

9. The process recited in claim 7 wherein said producing step comprises producing an adherent thin film of electrically insulating material on the surface of said grooves.

10. A process for forming electrically isolated segments of semiconductor material in a common substrate comprising the steps of:
    forming grooves in a preselected pattern in one surface of a semiconductor body;
    producing an adherent thin film of electrically insulating material on said one surface of said semiconductor body and on the surface of said grooves, said film having a thickness which is insufficient to fill the grooves;
    depositing crystalline material sufficient to form a substrate in said grooves and on the surface of said thin film, said crystalline material having thermal expansion characteristics compatible with said semiconductor body and being a different material than said thin film; and
    removing from the resulting structure enough material from the side opposite said one surface to expose at said opposite side a portion of said electrically insulating thin film which was formed on the surface of said grooves, while leaving electrically isolated semiconductor segments of a desired thickness exposed at said opposite side.

11. The process recited in claim 10 wherein said producing stem comprises converting the surface of the semiconductor material to an insulating composition in situ.

12. The process recited in claim 11 wherein said producing step is accomplished by oxidizing the surface of the semiconductor body.

13. The process recited in claim 11 wherein said producing step is accomplished by nitridizing the surface of the semiconductor body.

14. The process recited in claim 10 wherein said forming step is accomplished by etching the semiconductor body.

15. The process recited in claim 10 wherein said removing step is accomplished by lapping said opposite side of said resulting structure.

16. The process recited in claim 10 wherein said depositing step comprises depositing electrically insulating crystalline material.

17. The process recited in claim 10 further comprising the steps of:
    fabricating devices in the individual semiconductor segments; and
    forming electrical conductors interconnecting devices in different segments.

18. The process of claim 10 wherein said semiconductor material is selected from the group consisting of silicon, germanium and intermetallic compounds.

19. The process of claim 10 wherein said thin insulating film comprises a material selected from the group consisting of silicon nitride, silicon oxide and other thermally compatible electrically insulating materials which may be produced as a thin film.

20. The process of claim 10 wherein the crystalline support material is selected from the group consisting of silicon, alumina and beryllium oxide.

21. The process recited in claim 10 wherein said thin film of electrically insulating material comprises a compound of silicon, said process further comprising the additional steps of:
    depositing carbon on the insulating film; and
    heating the insulating film to form silicon carbide nucleation centers for the growth of the crystalline substrate;
    both additional steps being performed prior to performing the depositing step.

22. The process recited in claim 10 wherein said crystalline material is vapor deposited.

23. A process for producing from a semiconductor body electrically isolated segments thereof on a common substrate comprising the steps of:
    producing a first film of electrically isolating material on one side of said semiconductor body;
    depositing a substrate material on said first film;
    forming grooves through said semiconductor in a pattern outlining desired segments, said grooves being made from the other side of said semiconductor to said first film;
    producing a second film of electrically isolating material on the surface of said grooves, said film having a thickness which is insufficient to fill said grooves; and
    depositing substrate material on said second film in said grooves until they are filled, said substrate material being a different material than either of said films.

24. The process recited in claim 23 further comprising the step of:
    removing a part of the resulting structure on said other side of said semiconductor to expose the semiconductor segments and the isolating material in the grooves between the semiconductor segments.

* * * * *